US011912162B2

(12) United States Patent
Nakagawa (10) Patent No.: US 11,912,162 B2
(45) Date of Patent: Feb. 27, 2024

(54) BATTERY MANAGEMENT SYSTEM FOR ELECTRIC VEHICLES AND ELECTRIC VEHICLE

(71) Applicant: SUBARU CORPORATION, Tokyo (JP)

(72) Inventor: Isao Nakagawa, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 336 days.

(21) Appl. No.: 17/489,091

(22) Filed: Sep. 29, 2021

(65) Prior Publication Data
US 2022/0105829 A1    Apr. 7, 2022

(30) Foreign Application Priority Data

Oct. 1, 2020    (JP) ................. 2020-167370

(51) Int. Cl.
| | |
|---|---|
| *B60L 58/16* | (2019.01) |
| *B60L 50/51* | (2019.01) |
| *G01R 31/367* | (2019.01) |
| *G01R 31/392* | (2019.01) |
| *H01M 10/44* | (2006.01) |
| *B60L 58/12* | (2019.01) |
| *H01M 10/42* | (2006.01) |

(52) U.S. Cl.
CPC ............. *B60L 58/16* (2019.02); *B60L 50/51* (2019.02); *B60L 58/12* (2019.02); *G01R 31/367* (2019.01); *G01R 31/392* (2019.01); *H01M 10/425* (2013.01); *H01M 10/44* (2013.01); *H01M 2010/4271* (2013.01); *H01M 2220/20* (2013.01)

(58) Field of Classification Search
CPC .......... B60L 58/16; B60L 50/51; B60L 58/12; B60L 2240/16; B60L 2240/64; B60L 2260/32; G01R 31/367; G01R 31/392; G01R 31/007; H01M 10/425; H01M 10/44; H01M 2010/4271; H01M 2220/20; Y02T 10/72; Y02T 10/70; Y02E 60/10
See application file for complete search history.

(56) References Cited

U.S. PATENT DOCUMENTS

| | | | |
|---|---|---|---|
| 2013/0134778 A1 | 5/2013 | Tamanaha | |
| 2014/0089692 A1 | 3/2014 | Hanafusa | |

FOREIGN PATENT DOCUMENTS

| | | |
|---|---|---|
| JP | 2013-115863 A | 6/2013 |
| JP | 2015-027223 A | 2/2015 |
| WO | 2013/140781 A1 | 9/2013 |

*Primary Examiner* — Bhavesh V Amin
(74) *Attorney, Agent, or Firm* — Rimon P.C.

(57) ABSTRACT

A battery management system for electric vehicles includes electric vehicles each including a battery to supply electric power to a driving motor and an information processor to communicate with the electric vehicles. The electric vehicles each include a degradation state detector to detect a degradation state of the battery, and a usage state detector to detect a usage state of the battery. The information processor include a battery information storage to store information about the degradation state and the usage state of the battery, a degradation state estimator to estimate a future degradation state of the battery of a specific electric vehicle, based on the information stored in the battery information storage, and a vehicle control changer to change control of a certain electric vehicle to delay degradation of the battery if the future degradation state of the battery is estimated to deteriorate by a predetermined amount or greater.

11 Claims, 4 Drawing Sheets

BATTERY MANAGEMENT SYSTEM FOR ELECTRIC VEHICLES AND ELECTRIC VEHICLE

CROSS-REFERENCE TO RELATED APPLICATIONS

The present application claims priority from Japanese Patent Application No. 2020-167370 filed on Oct. 1, 2020, the entire contents of which are hereby incorporated by reference.

BACKGROUND

The disclosure relates to a battery management system for electric vehicles and an electric vehicle in which vehicle control can be performed suitably in accordance with the degradation state of a battery.

In electric vehicles, such as engine-electric hybrid vehicles and pure electric vehicles (EV), an excessive level of degradation of a driving battery, which supplies power to a driving motor of a vehicle, adversely influences the performance of the vehicle, such as the output torque and driving range of the vehicle. It is thus desirable to appropriately determine the degradation state of a battery and also to suitably control charging/discharging of the battery so that the degradation state is contained within an acceptable range and the degradation of the battery is delayed.

As an example of the related art regarding battery management for an electric vehicle, Japanese Unexamined Patent Application Publication (JP-A) No. 2013-115863 discloses the following technology. A degradation parameter coefficient based on degradation-related parameters, such as the vehicle weight, outside temperature, and total driving time, is reflected in power consumption control for a battery, for example. An actual battery degradation degree is calculated based on the actual remaining amount of the battery at the time when the vehicle has finished driving and a table for calculating the degradation parameter coefficient is updated based on the calculated actual battery degradation degree.

International Publication No. 2013/140781 discloses the following technology though it is not related to vehicles. Identification information indicating a storage cell system and property data indicating the state of a subject storage cell are received via a communication network. By using a degradation model representing a degradation tendency of another storage cell managed in a database, a degradation model of the subject storage cell is determined based on the received property data, and control data for delaying the degradation of the subject storage cell is generated.

JP-A No. 2015-27223 discloses a battery replacement management system for managing the replacement of chargeable batteries used in electric vehicles, for example. The degradation degree of each battery is estimated from accumulated charging information, such as the number of charging times or fully charged capacity, of each battery. The estimated degradation degree of each battery is compared with that of another battery. If the difference in the degradation degree between the batteries of some electric vehicles is found to be greater than or equal to a predetermined threshold, an instruction is given to exchange such batteries between the electric vehicles. As a result, the degradation degree of batteries in plural electric vehicles can be made uniform.

SUMMARY

An aspect of the disclosure provides a battery management system for electric vehicles. The battery management system includes plural electric vehicles and an information processor. The plural electric vehicles each include a battery configured to supply electric power to a driving motor. The information processor is configured to be able to communicate with the plural electric vehicles. Each of the plural electric vehicles includes a degradation state detector and a usage state detector. The degradation state detector is configured to detect a degradation state of the battery. The usage state detector is configured to detect a usage state of the battery. The information processor includes a battery information storage, a degradation state estimator, and a vehicle control changer. The battery information storage is configured to store information about the degradation state and the usage state of the battery of each of the plural electric vehicles. The degradation state estimator is configured to estimate a future degradation state of the battery of a specific electric vehicle among the plural electric vehicles, based on the information stored in the battery information storage. The vehicle control changer is configured to change control of a certain electric vehicle among the plural electric vehicles so as to delay degradation of the battery of the certain electric vehicle in a case where the degradation state estimator has estimated that the future degradation state of the battery of the certain electric vehicle is to be decreased by a predetermined amount or greater.

An aspect of the disclosure provides an electric vehicle. The electric vehicle includes a battery configured to supply electric power to a driving motor. The electric vehicle include a degradation state detector, a usage state detector, and a communicator. The degradation state detector is configured to detect a degradation state of the battery. The usage state detector is configured to detect a usage state of the battery. The communicator is configured to send information about the degradation state and the usage state of the battery to an information processor disposed outside the electric vehicle. The communicator is configured to receive an instruction to change vehicle control from the information processor in a case where the information processor has estimated that a future degradation state of the battery of the electric vehicle is to be decreased by a predetermined amount or greater. The electric vehicle is configured to change control performed in the electric vehicle in response to receiving the instruction so as to delay degradation of the battery of the electric vehicle.

An aspect of the disclosure provides a battery management system for electric vehicles. The battery management system includes plural electric vehicles and an information processor. The electric vehicles each include a battery configured to supply electric power to a driving motor. The information processor is configured to be able to communicate with the plural electric vehicles. Each of the plural electric vehicles includes circuitry. The circuitry is configured to detect a degradation state of the battery. The circuitry is configured to detect a usage state of the battery. The information processor includes a battery information storage and circuitry. The battery information storage is configured to store information about the degradation state and the usage state of the battery of each of the plural electric vehicles. The circuitry is configured to estimate a future degradation state of the battery of a specific electric vehicle among the plural electric vehicles, based on the information stored in the battery information storage. The circuitry is configured to change control of a certain electric vehicle among the plural electric vehicles so as to delay degradation of the battery of the certain electric vehicle in a case where the future degradation state of the battery of the certain electric vehicle is estimated to be decreased by a predetermined amount or greater.

An aspect of the disclosure provides an electric vehicle including a battery which is configured to supply electric power to a driving motor. The electric vehicle includes circuitry. The circuitry is configured to detect a degradation state of the battery. The circuitry is configured to detect a usage state of the battery. The circuitry is configured to send information about the degradation state and the usage state of the battery to an information processor disposed outside the electric vehicle. The circuitry is configured to receive an instruction to change vehicle control from the information processor in a case where the information processor has estimated that a future degradation state of the battery of the electric vehicle is to be decreased by a predetermined amount or greater. The circuitry is configured to change control performed in the electric vehicle in response to receiving the instruction so as to delay degradation of the battery of the electric vehicle.

BRIEF DESCRIPTION OF THE DRAWINGS

The accompanying drawings are included to provide a further understanding of the disclosure and are incorporated in and constitute a part of this specification. The drawings illustrate an example embodiment and, together with the specification, serve to explain the principles of the disclosure.

DETAILED DESCRIPTION

Driving batteries for electric vehicles tend to be degraded considerably differently depending on the environments around the electric vehicles (the temperature difference and the road condition, for example) and how the vehicles drive, compared with other types of batteries such as industrial batteries.

To deal with this tendency of driving batteries, possible usage conditions of batteries in vehicles may be determined from the region where the vehicles are used, and a control program for preventing the batteries from being excessively degraded by restricting charge/discharge power (current value, for example), for example, may be installed in product vehicles. In this case, however, for a large number of vehicles, the batteries may be overprotected and fail to exhibit their proper performance, which may restrict the performance of the vehicles.

If a battery is used under more severe conditions than the assumed usage conditions, it may not be possible to sufficiently regulate the degradation of the battery, which may seriously impair the performance of the vehicle.

In terms of the above-described issues, it is desirable to provide a battery management system for electric vehicles and an electric vehicle in which vehicle control can be performed suitably in accordance with the degradation state of a battery.

An embodiment of a battery management system for electric vehicles (hereinafter simply called the battery management system) and an electric vehicle will be described below. In the following, the embodiment is described in detail with reference to the accompanying drawings. Note that the following description is directed to an illustrative example of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiment which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same numerals to avoid any redundant description.

The battery management system of the embodiment includes a server. The information processor estimates the future degradation state (state of health (SOH)) of a driving battery stored in each of plural electric vehicles, which are client vehicles. If the future degradation state (SOH) of a battery of an electric vehicle is estimated to be decreased by a predetermined amount or greater, the information processor changes control of this electric vehicle so as to delay the degradation of the battery. In one embodiment, the server may serve as an "information processor".

Figure 1:
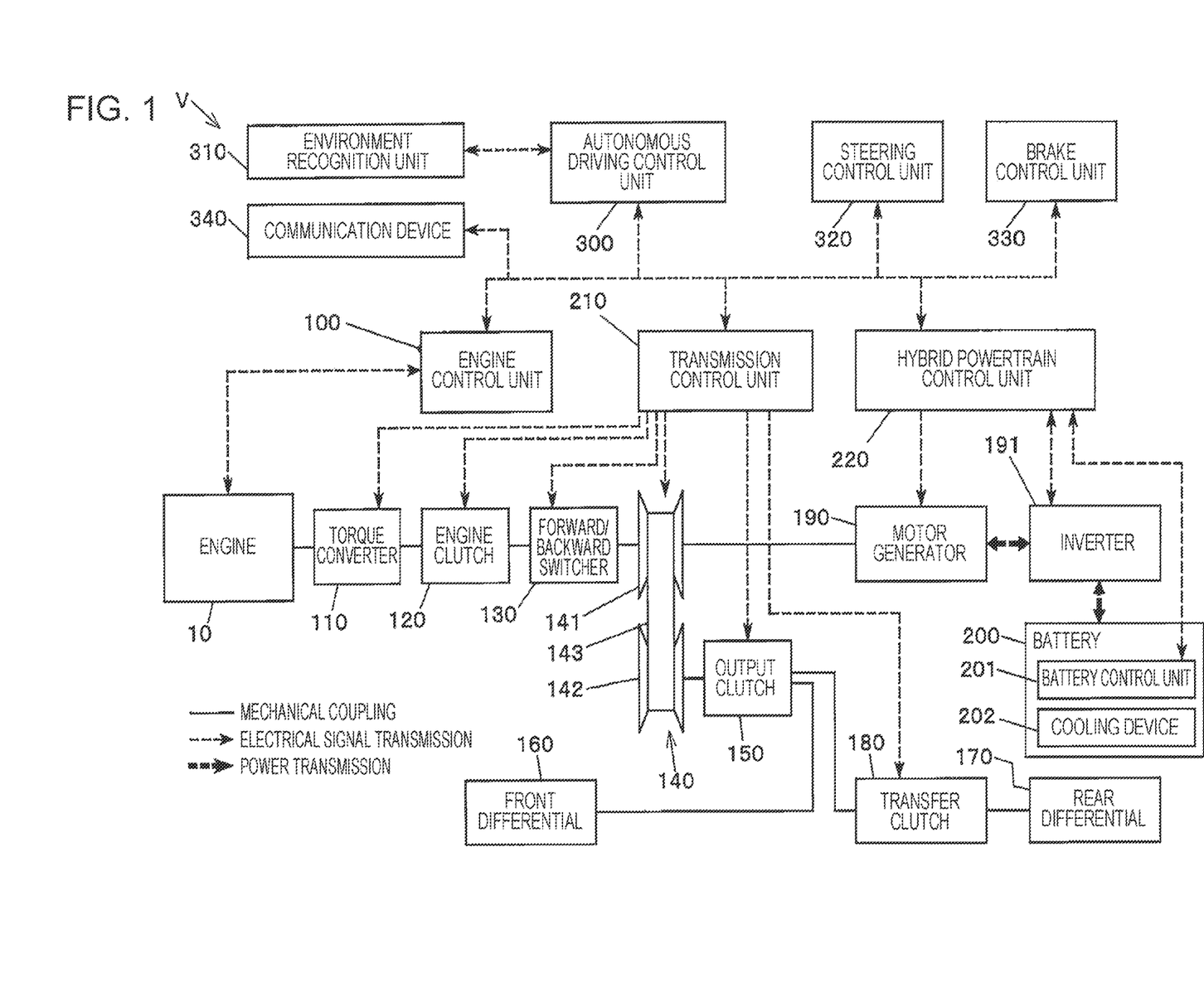
FIG. 1 is a block diagram schematically illustrating an example of the configuration of an electric vehicle, which is a client vehicle used in an embodiment of a battery management system.

FIG. 1 is a block diagram schematically illustrating an example of the configuration of an electric vehicle (hereinafter simply called a vehicle V), which is a client vehicle used in the embodiment of the battery management system. The vehicle V is also an electric vehicle of the embodiment.

The vehicle V illustrated in FIG. 1 is an automobile, such as a passenger car, and is an engine-electric parallel hybrid vehicle.

The vehicle V is an engine-electric parallel hybrid all-wheel drive (AWD) vehicle, for example, including an engine 10, an engine control unit (ECU) 100, a torque converter 110, an engine clutch 120, a forward/backward switcher 130, a variator 140, an output clutch 150, a front differential 160, a rear differential 170, a transfer clutch 180, a motor generator 190, a battery 200, a transmission control unit 210, a hybrid powertrain control unit 220, an autonomous driving control unit 300, an environment recognition unit 310, a steering control unit 320, a brake control unit 330, and a communication device 340, for example.

The engine 10 is a flat four-stroke four-cylinder direct injection (in-cylinder injection) gasoline engine, for example, and is loaded together with the motor generator 190 as a power source for driving the vehicle V.

Output of the engine 10 is transmitted to the driving wheels of the vehicle V via a power transmission mechanism, which will be discussed later.

The engine control unit 100 is a control device that comprehensively controls the engine 10 and engine accessories.

Based on the intended torque set by the hybrid powertrain control unit 220 in response to an instruction from the autonomous driving control unit 300, the engine control unit 100 controls various values, such as the opening degree of a throttle valve, fuel injection amount and timing, ignition timing, and valve timing so that the actual torque matches the intended torque.

The torque converter 110 is a fluid coupling that transmits output of the engine 10 to the engine clutch 12.

The torque converter 110 also serves as a starting device that transmits engine torque to a vehicle which is not in motion.

The torque converter 110 also includes a lock up clutch (not illustrated), which is controlled by the transmission control unit 210 and directly couples the input side (impeller) and the output side (turbine) to each other.

The engine clutch 120 is provided between the torque converter 110 and the forward/backward switcher 130, and connects or disconnects the power transmission path between these two components.

The engine clutch 120 disconnects the power transmission path in response to an instruction from the transmission control unit 210 when the vehicle V is in an electric-vehicle (EV) drive mode, for example. In the EV drive mode, the vehicle V stops the engine 10 and drives from output of the motor generator 190.

The forward/backward switcher 130 is provided between the engine clutch 120 and the variator 140. The forward/backward switcher 130 switches between a forward mode and a backward mode in response to an instruction from the transmission control unit 210. In the forward mode, the torque converter 110 and the variator 140 are directly coupled to each other. In the backward mode, the rotation output of the torque converter 110 is reversed and is transmitted to the variator 140.

The forward/backward switcher 130 includes a planetary pinion set, for example.

The variator 140 is a variable transmission mechanism that continuously changes rotation output of the engine 10, which is transmitted from the forward/backward switcher 130, and rotation output of the motor generator 190.

The variator 140 is a chain-based continuously variable transmitter (CVT) including a primary pulley 141, a secondary pulley 142, and a chain 143, for example.

The primary pulley 141 is disposed on the input side of the variator 140 when the vehicle V is driving (on the output side when the vehicle V is regenerating power) and receives rotation output of the engine 10 and the motor generator 190.

The secondary pulley 142 is disposed on the output side of the variator 140 when the vehicle V is driving (on the input side when the vehicle V is regenerating power). The secondary pulley 142 is disposed adjacent to the primary pulley 141 and is rotatable about its rotating shaft which is disposed in parallel with the rotating shaft of the primary pulley 141.

The chain 143, which is formed in a ring-like shape, is wound on the primary pulley 141 and the secondary pulley 142 and transmits driving power therebetween.

The primary pulley 141 and the secondary pulley 142 each have a pair of sheaves holding the chain 143. The primary pulley 141 and the secondary pulley 142 can continuously vary the pitch diameter of the sheaves by changing the distance between the sheaves in accordance with transmission control performed by the transmission control unit 210.

The output clutch 150 is provided between the secondary pulley 142 of the variator 140 and each of the front differential 160 and the transfer clutch 180, and connects or disconnects the power transmission path between these components.

Normally, the output clutch 150 connects the power transmission path when the vehicle V is driving. The output clutch 150 disconnects the power transmission path when the vehicle V is stopped and the battery is charged by driving the motor generator 190 using output of the engine 10.

The front differential 160 transmits driving power from the output clutch 150 to the left and right front wheels.

The front differential 160 includes a final reduction drive and a differential mechanism that absorbs a rotational speed difference between the left and right front wheels.

The output clutch 150 and the front differential 160 are directly coupled to each other.

The rear differential 170 transmits driving power from the output clutch 150 to the left and right rear wheels.

The rear differential 170 includes a final reduction drive and a differential mechanism that absorbs a rotational speed difference between the left and right rear wheels.

The transfer clutch 180 is disposed in a rear-wheel driving force transmission mechanism that transmits a driving force from the output clutch 150 to the rear differential 170, and connects or disconnects the power transmission path between the output clutch 150 and the rear differential 170.

The transfer clutch 180 is a hydraulic or electromagnetic multiplate wet clutch that can continuously change the engagement force (transmission torque capacity) to be used when the power transmission path is connected.

The engagement force of the transfer clutch 180 is controlled by the transmission control unit 210. As a result of changing the engagement force, the transfer clutch 180 is able to adjust the driving torque split ratio between the front and rear wheels.

When the vehicle V is turning or when antilock braking system control or vehicle behavior control is being performed, a rotational speed difference is generated between the front and rear wheels. In this case, the transfer clutch 180 decreases (releases) the engagement force to cause the vehicle V to slip so as to absorb the rotational speed difference.

The motor generator 190 is an electric machine (driving motor) that generates a driving force for the vehicle V and also performs energy recovery for regenerating power using torque transmitted from the wheels when the vehicle V is decelerating.

The motor generator 190 is disposed concentrically with the primary pulley 141 of the variator 140. The primary pulley 141 is coupled to a rotor (not illustrated) of the motor generator 190 via the rotating shaft of the primary pulley 141.

As the motor generator 190, a permanent magnet synchronous motor, for example, is used.

Torque to be output when the motor generator 190 is driving and the amount of recovery energy (input torque) to be generated when the motor generator 190 regenerates power are controlled by the hybrid powertrain control unit 220.

The motor generator 190 receives electric power from the battery 200 via an inverter 191 when it is driving.

The inverter 191 converts a direct current (DC) discharged from the battery 200 into an alternating current (AC) and supplies AC power to the motor generator 190.

In the unit including the inverter 191, an AC-to-DC converter is also disposed. This AC-to-DC converter converts AC power output from the motor generator 190 during power regeneration to DC power and supplies the DC power to the battery 200.

The battery 200 is a secondary cell (driving battery) that supplies electric power to the motor generator 190 via the inverter 191 and that is also charged by electric power regenerated by the motor generator 190.

As the battery 200, a lithium-ion battery or a nickel-metal hydride battery, for example, may be used. The battery 200 may be a high-voltage battery having a rated voltage of about 300 V, for example, and mainly outputs driving power for the vehicle V.

The battery management system of the embodiment manages the battery 200 of each of multiple client vehicles V1, V2, V3, . . . (see FIG. 2). This will be discussed later in detail.

In the battery 200, a battery control unit 201 and a cooling device 202 are provided.

The battery control unit 201 detects the states of a battery cell stored in the battery 200, such as the charge/discharge history, environment information such as the temperature, state of charge (SOC), and state of health (SOH), and also detects and calculates variable values, such as the voltage, maximum output current, and charge/discharge current.

The SOC is a value of the current charging level of the battery 200 represented by percentage points (fully charged state is 100%, while fully discharged state is 0%).

The SOH is an index representing the state of health and the state of degradation of the battery 200. The SOH is the ratio (percentage points) of the fully charged capacity of a degraded battery 200 to that of a new battery (100%).

The SOH may be calculated by using a predetermined function and various factors regarding the battery 200, such as the ambient temperature, charge/discharge current, how often the battery 200 is charged/discharged, and how long the battery 200 is left unused, as parameters.

The battery control unit 201 detects the SOH of the battery 200 and a usage state detector that detects the usage state of the battery 200. In one embodiment, the battery control unit 201 may serve as a "degradation state detector".

The battery control unit 201 control the cooling device 202 so that the battery cell is kept in a suitable temperature range.

The cooling device 202 cools the battery 200 to prevent an excessive temperature rise of the battery 200 while the vehicle V is running.

If necessary, the cooling device 202 performs pre-cooling and post-cooling. In pre-cooling, before the vehicle V starts driving, the battery 200 is cooled in advance. In post-cooling, after the vehicle V is driven (the end of a driving cycle, for example, after the ignition switch, which is the main power supply of the vehicle V, is turned OFF), the battery 200 is cooled until it reaches a target temperature.

The transmission control unit 210 comprehensively controls the lock up clutch of the torque converter 110, the engine clutch 120, the forward/backward switcher 130, the variator 140, the output clutch 150, and the transfer clutch 180, for example.

The hybrid powertrain control unit 220 controls the output torque of the motor generator 190 and braking force (power regeneration amount) during regenerative braking, and also controls charging/discharging of the battery 200, together with the battery control unit 201.

The hybrid powertrain control unit 220 performs control in collaboration with the engine control unit 100 so as to set the allocation ratio between the engine 10 and the motor generator 190 to achieve the intended torque set by the autonomous driving control unit 300.

Under the control of a battery control program, the hybrid powertrain control unit 220 also sets the ratio of the braking force between regenerative brakes using the motor generator 190 and hydraulic service brakes to achieve the intended braking force set by the autonomous driving control unit 300.

During these setting operations, the hybrid powertrain control unit 220 controls the output torque and the power regeneration amount of the motor generator 190 so that charge/discharge power of the battery 200 does not exceed a limit value set by the battery control program.

The battery control program is stored in the hybrid powertrain control unit 220. The battery control program restricts charge/discharge power and the frequency with which the battery 200 is charged/discharged so that the battery 200 does not seriously deteriorate.

Discharge power of the battery 200 may be restricted by limiting torque to be output when the motor generator 190 is driving.

Charge power of the battery 200 may be restricted by limiting the amount of power to be regenerated during energy recovery of the motor generator 190.

The autonomous driving control unit 300 performs autonomous driving control for implementing autonomous driving of the vehicle V.

The autonomous driving control unit 300 sets a route based on a destination set by a driver user or a passenger user, for example, using an input unit (not illustrated). The autonomous driving control unit 300 also generates an autonomous driving scenario regarding the target driving path and the target vehicle speed transition, for example, based on information output from the environment recognition unit 310. The autonomous driving control unit 300 then comprehensively controls driving, braking, and steering of the vehicle V so that the actual driving path and vehicle speed transition match the target driving path and vehicle speed transition of the generated autonomous driving scenario.

The route set by the autonomous driving control unit 300 may be changed in response to an instruction from a server 400 if the future SOH of the battery 200 is estimated to be decreased by a predetermined amount or greater. This will be explained later in detail.

The environment recognition unit 310 obtains information about geographical features, such as the road shapes around the vehicle V, and obstacles, such as other vehicles, pedestrians, and buildings, by using various sensors.

Examples of sensors coupled to the environment recognition unit 310 are a stereo camera, a monocular camera, a millimetric wave radar device, a 3D light detection and ranging, laser imaging, detection, and ranging (LiDAR), and a blind spot monitor.

Information about the environments around the vehicle V obtained by the environment recognition unit 310 is sent to the autonomous driving control unit 300.

The steering control unit 320 comprehensively controls a steering device, which steers the front wheels of the vehicle V, and accessories of the steering device (such as sensors).

The steering control unit 320 controls the driving output and amount of an electric motor (actuator). The electric motor drives steering rack shafts to perform translational movement in the widthwise direction of the vehicle V. The steering rack shafts are each coupled to a hub bearing housing (steering knuckle) via a tie rod. The corresponding front wheels are attached to the hub bearing housings.

During autonomous driving, in response to an instruction from the autonomous driving control unit 300, the steering control unit 320 controls the electric motor so that the actual path of the vehicle V matches the target driving path.

The brake control unit 330 controls the hydraulic pressure of a brake fluid in a hydraulic service brake provided in each wheel of the vehicle V.

The brake control unit 330 provides an instruction to a hydraulic control unit (not illustrated) that individually controls the hydraulic pressure in a wheel cylinder of the hydraulic service brake provided in each wheel.

The hydraulic control unit includes an electric pump that applies pressure to a brake fluid and an electromagnetic valve that individually controls the hydraulic pressure of a brake fluid in each wheel cylinder.

The brake control unit 330 performs vehicle stability control. In one example, during antilock braking control or in case of the occurrence of oversteer or understeer of the vehicle V, the brake control unit 330 performs vehicle stability control so that a moment is generated to implement antilock braking control or attenuate the above-described oversteer or understeer of the vehicle V by producing a braking force difference between the left and right front wheels or the left and right rear wheels.

During autonomous driving of the vehicle V, the brake control unit 330 controls the braking force of the hydraulic service brakes in accordance with the target deceleration set by the autonomous driving control unit 300.

The brake control unit 330 also performs collaborative brake control with the regenerative brakes using the motor generator 190 and the hydraulic service brakes.

In collaborative brake control, in collaboration with the hybrid powertrain control unit 220, the brake control unit 330 sets the ratio of the braking force between the regenerative brakes using the motor generator 190 and the hydraulic service brakes so that the amount of power to be regenerated by the motor generator 190 does not exceed a limit value.

The communication device 340 communicates with the server 400, which will be discussed later.

The communication device 340 includes a terminal based on a wireless mobile communication system, for example.

The above-described units and the communication device 340 can communicate with each other to send and receive information via a controller area network (CAN) communication system, for example. The CAN communication system is one type of in-vehicle local area network (LAN) system.

The above-described units are each constituted by an information processor, such as a central processing unit (CPU), storages, such as a random access memory (RAM) and a read only memory (ROM), an input/output interface, and a bus which couples these elements with each other.

Figure 2:
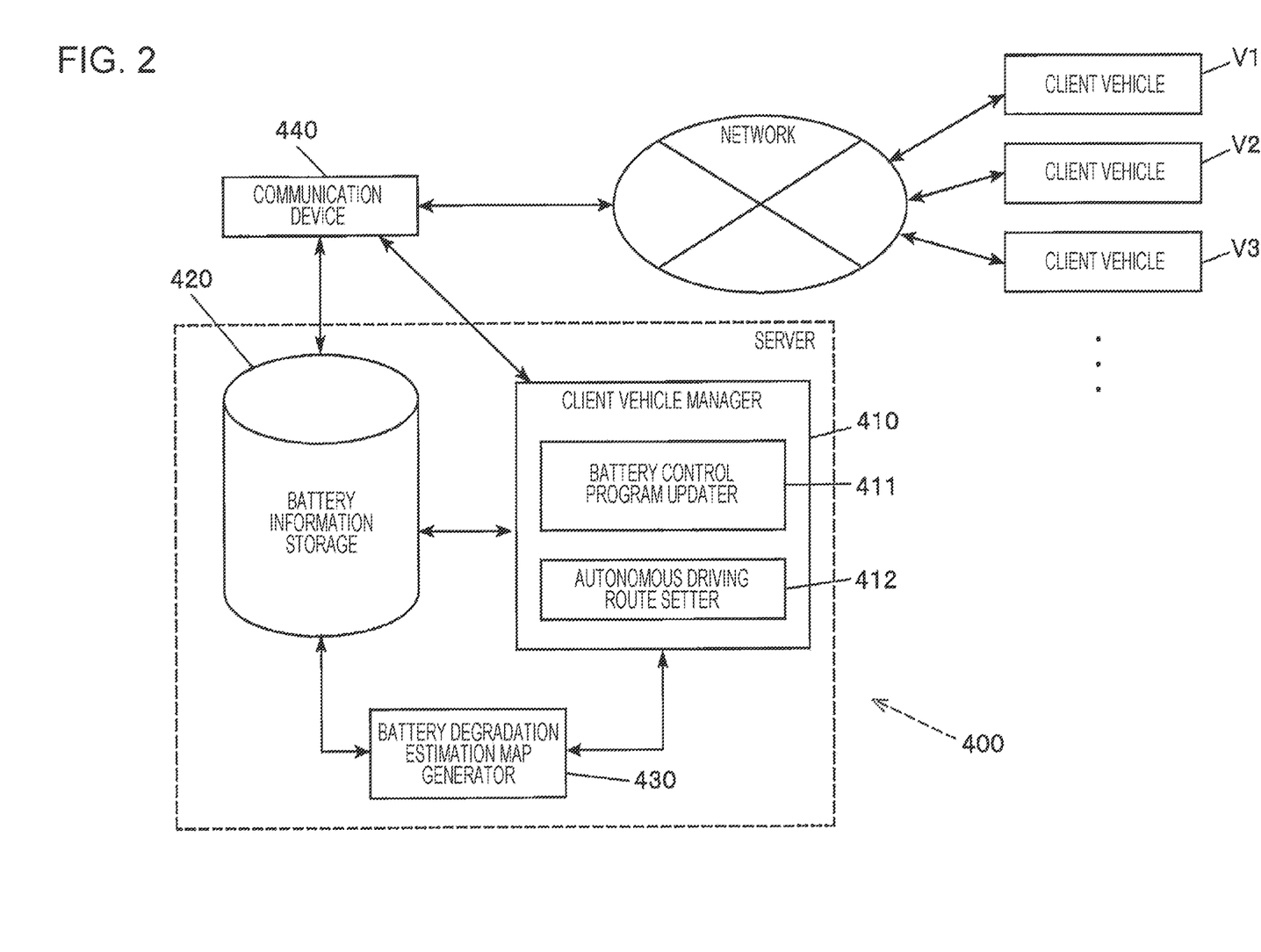
FIG. 2 is a block diagram schematically illustrating the configuration of the battery management system of the embodiment.

FIG. 2 is a block diagram schematically illustrating the configuration of the battery management system of the embodiment.

The battery management system of the embodiment includes a server 400 and multiple client vehicles V1, V2, V3, . . . , Vn (n is an integer) which are configured similarly to the above-described vehicle V. The server 400 is coupled to the client vehicles V1, V2, V3, . . . , Vn via a network, such as the internet, so that it can communicate with the client vehicles. In one embodiment, the server 400 may serve as an "information processor".

The server 400 includes a client vehicle manager 410, a battery information storage 420, a battery degradation estimation map generator 430, and a communication device 440, for example.

The vehicle control changer communicates with each of the client vehicles V1, V2, V3, . . . via the communication device 440 to obtain the degradation state (SOH) and the usage state of the battery 200, such as the outside temperature history and charge/discharge history, detected in each client vehicle. If necessary, for each client vehicle, the client vehicle manager 410 updates the battery control program and in-vehicle software regarding the route setting and drive pattern used in autonomous driving control. In one embodiment, the client vehicle manager 410 may serve as a "vehicle control changer".

The client vehicle manager 410 includes a battery control program updater 411 and an autonomous driving route setter 412.

The battery control program updater 411 changes and updates the battery control program of a client vehicle whose battery 200 has deteriorated to a predetermined level or lower and the future SOH is estimated to be decreased by a predetermined amount or greater. The battery control program updater 411 updates the battery control program of such a client vehicle so as to delay the degradation of the battery 200.

To regulate the degradation of the battery 200, the battery control program updater 411 updates the current battery control program to change the following factors; reducing discharge power (current) by restricting torque to be output from the motor generator 190; reducing charge power (current) by restricting the amount of power to be regenerated in the motor generator 190; driving the motor generator 190 less frequently (if the motor generator 190 has been driven a certain number of times, the use of the motor generator 190 is stopped and the engine 10 is used to drive the client vehicle); using the regenerative brakes of the motor generator 190 less frequently (if the regenerative brakes have been used a certain number of times, the use of the regenerative brakes is stopped and the hydraulic service brakes are used for performing brake control); using accessory units, such as an air-conditioner, less frequently; performing pre-cooling of the battery 200 with the cooling device 202 before the vehicle V starts driving (if the next driving has been scheduled); and performing post-cooling of the battery 200 after the vehicle V is driven.

Not all the above-described factors are to be changed together and may be changed one by one in accordance with the degree of degradation of the battery 200.

The limit value of the charge/discharge power may be changed progressively or non-progressively in accordance with the degree of degradation of the battery 200.

It is now assumed that, in a client vehicle to drive under autonomous driving control, the battery 200 has deteriorated to a predetermined level or lower and the future SOH is estimated to be decreased by a predetermined amount or greater. In this case, if a destination for the client vehicle is input, the autonomous driving route setter 412 changes the route set by the autonomous driving control unit 300 so as to delay the degradation of the battery 200.

The autonomous driving route setter 412 stores high-precision 3D map data and is able to obtain the current road condition, traffic conditions regarding other vehicles, and weather information, for example, from an information source (not illustrated) via a network.

To regulate the degradation of the battery 200, the autonomous driving route setter 412 selects a route so that the client vehicle less frequently climbs slopes of a certain gradient level or higher and/or less frequently performs acceleration/deceleration.

For the client vehicle to climb slopes less frequently, the autonomous driving route setter 412 sets a route so that the vehicle can use a road with fewer slopes and bypass mountainous and hilly areas.

For the client vehicle to reduce the frequency of acceleration/deceleration, the autonomous driving route setter 412 sets a route with fewer crossroads, traffic lights, and pedestrian crossings where the vehicle is likely to stop. The autonomous driving route setter 412 may select a route to avoid areas where traffic congestion is likely to occur, which has been detected by machine learning.

The autonomous driving route setter 412 also sets a drive pattern, such as the standard levels of the acceleration, deceleration, and vehicle speed during cruising.

In addition to or instead of the above-described route changing, the autonomous driving route setter 412 may change the above-described drive pattern so as to delay the degradation of the battery 200. For example, the autonomous driving route setter 412 may set a lower vehicle speed during cruising, as well as reducing the standard acceleration/deceleration.

Information about the SOH and the usage state of the battery 200 sent from each of the multiple client vehicles V1, V2, V3, . . . may be formed into a database and be stored in the battery information storage 420 as big data.

The battery degradation estimation map generator 430 generates a battery degradation estimation map, based on information stored in the battery information storage 420. From the battery degradation estimation map, the future SOH of the battery 200 of a certain vehicle can be estimated based on the current degradation state (SOH) of the battery 200 and the usage state of the battery 200 up to the present.

Generating of a battery degradation estimation map will be discussed later in detail.

The communication device 440 communicates with the communication device 340 of each client vehicle via a network.

Figure 3:
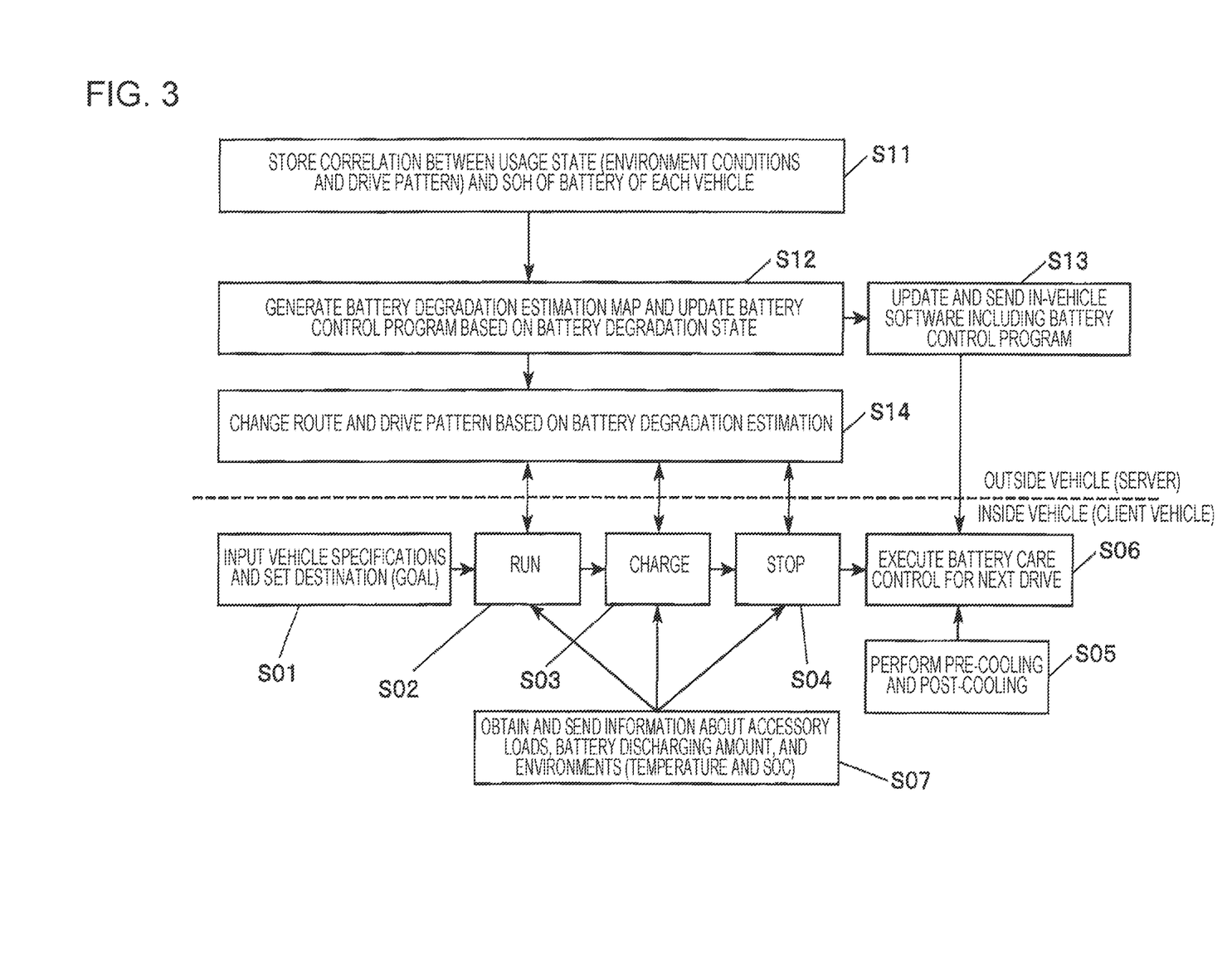
FIG. 3 illustrates the functions of the battery management system of the embodiment.

FIG. 3 illustrates the functions of the battery management system of the embodiment.

In FIG. 3, the lower side from the broken line illustrates the functions inside the client vehicle, while the upper side from the broken line illustrates the functions outside the client vehicle (the functions of the server 400).

Inside the client vehicle, a driver user or a passenger user, for example, sets a destination (goal) of the client vehicle to drive under autonomous driving control (step S01).

The specifications of the client vehicle have been input (step S01). Various control operations are performed based on the specifications of the client vehicle.

The autonomous driving control unit 300 sets a driving route of the vehicle, based on the destination set by the user.

In response to a start operation from the user, the vehicle starts driving under autonomous driving control.

During an autonomous driving cycle (from when the vehicle starts driving until when it reaches the destination), the vehicle repeats operations: running by driving the motor generator 190 receiving electric power from the battery 200 (step S02); charging the battery 200 by the motor generator 190 regenerating power (step S03); and stopping (step S04).

After the autonomous driving cycle, the battery control unit 201 executes battery care control to regulate the degradation of the battery 200 (step S06), such as performing post-cooling (pre-cooling for the next drive) for the battery 200 using the cooling device 202 (step S05).

The content of battery care control (such as the target cooling temperature and cooling time) is managed by the battery control program stored in the battery control unit 201.

During the autonomous driving cycle, based on the state of the vehicle in each of the operations: running (step S02); charging (step S03); and stopping (step S04), the battery control unit 201 obtains information about the SOH of the battery 200 and information about the usage state of the battery 200, such as the driving conditions of the vehicle (conditions of accessory loads, for example), the discharging amount of the battery 200, atmospheric temperature, battery cell temperature, and the SOC, and sends these items of information to the server 400 via the communication device 340 (step S07).

The battery information storage 420 of the server 400 accumulates information regarding the correlation between the usage state and the SOH of the battery 200 of each of the client vehicles V1, V2, V3, . . . , as big data (step S11).

From the correlation between the usage state and the SOH of the battery 200 of each client vehicle obtained based on data stored in the battery information storage 420, the battery degradation estimation map generator 430 generates a battery degradation estimation map from which the future transition of the SOH of a battery 200 under a specific usage state can be estimated (step S12).

Figure 4:
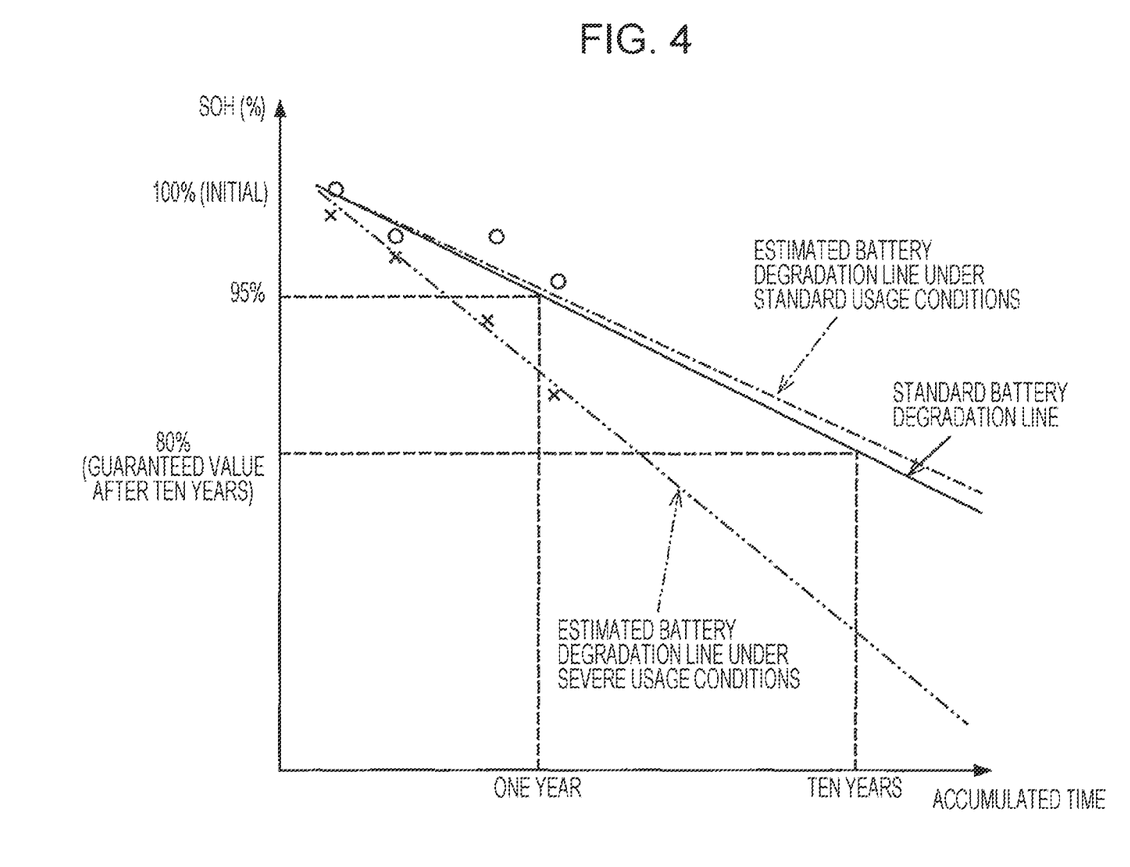
FIG. 4 is a graph illustrating an example of the degradation transition of a battery in the electric vehicle of the embodiment.

FIG. 4 is a graph illustrating an example of the degradation transition of a battery in an electric vehicle of the embodiment.

In FIG. 4, the horizontal axis indicates a period of time (year) elapsed from the start of the use of the battery 200, and the vertical axis indicates the SOH (%) of the battery 200.

In FIG. 4, data items about multiple client vehicles whose batteries 200 have been used under standard conditions, such as standard environment conditions and charge/discharge history conditions, are plotted with the circle mark and are subjected to approximate calculation, such as the method of least squares. The resulting estimated battery degradation line is indicated by the long dashed dotted line in FIG. 4.

It is now assumed that the SOH of a battery 200 is expected to be guaranteed to be 80% or higher after ten years of use. The above-described estimated battery degradation line is positioned slightly higher than a standard battery degradation line generated by setting the SOH to be 80% after ten years of use. In other words, this estimated battery degradation line represents that the batteries are less likely to deteriorate than that represented by the standard battery degradation line. Hence, vehicle control and battery control in the above-described client vehicles are suitable.

In FIG. 4, data items about multiple client vehicles whose batteries 200 have been used under relatively severe conditions are plotted with the cross mark and are subjected to approximate calculation, such as the method of least squares. The resulting estimated battery degradation line is indicated by the long dashed double-dotted line.

This estimated battery degradation line is positioned lower than the standard battery degradation line. In other words, this estimated battery degradation line represents that the batteries more likely to deteriorate than that represented by the standard battery degradation line. If current vehicle control and battery control continue to be performed, the SOH 80% is not likely to be guaranteed after ten years of use.

In this manner, in the battery degradation estimation map, estimated battery degradation lines are generated based on data of multiple client vehicles. To estimate (predict) how much the battery 200 of a certain client vehicle will be degraded, the estimated battery degradation line generated based on data about another client vehicle whose battery 200 has been used under usage conditions similar to those of the certain client vehicle is read. Then, the future transition of the SOH of this client vehicle can be estimated.

Regarding a client vehicle whose battery 200 has deteriorated to a predetermined level or lower and the future SOH is estimated to be decreased by a predetermined amount or higher, the battery control program updater 411 of the client vehicle manager 410 generates a battery control program unique to such a client vehicle in accordance with the battery degradation state (step S12). For example, for a client vehicle whose estimated battery degradation line is lower than the standard battery degradation line or whose estimated SOH after ten years of use is lower than a threshold (80%, for example), the battery control program updater 411 generates (updates) the battery control program of such a client vehicle.

In-vehicle software, such as the generated battery control program, is sent from the communication device 440 to a corresponding client vehicle as an instruction to change vehicle control (step S13).

In the client vehicle, the received in-vehicle software is updated at the end of the driving cycle (when the ignition switch is turned OFF or when battery care control is executed) (step S06).

If a destination is set in a client vehicle whose battery 200 has deteriorated to a predetermined level or lower, the autonomous driving route setter 412 obtains information of the route and drive pattern set by the autonomous driving control unit 300 of the client vehicle. The autonomous driving route setter 412 then changes the route and drive pattern (such as the standard levels of the acceleration, deceleration, and vehicle speed during cruising under autonomous driving control) so that the usage conditions of the battery 200 will be eased (step S14). The route and drive pattern set by the server 400 are sent to the client vehicle via the communication device 440.

In the client vehicle, an instruction to update the route and drive pattern is output to a driver user or a passenger user, for example, using an input/output device (touchscreen display, for example), which is not illustrated.

If the usage conditions of the battery 200 are eased, it may take more time to reach the destination by bypassing a mountain road or decreasing the acceleration/deceleration and vehicle speed, for example. Nevertheless, if the user has accepted updating the route and drive pattern using the input/output device, the client vehicle executes autonomous driving control in accordance with the route and drive pattern changed by the server 400.

According to the embodiment, the following advantages are achieved.

(1) Information about the degradation state (SOH) and the usage state of the battery 200 obtained from the battery control unit 201 of each of multiple client vehicles is accumulated, and a battery degradation estimation map is generated based on the accumulated information. Based on this battery degradation estimation map, the degradation state (SOH) of a battery 200 of a certain client vehicle is estimated. This configuration makes it possible to estimate the current SOH and the future SOH of the battery 200 more accurately than when the SOH of the battery 200 of a vehicle is estimated only in this vehicle by using information about this vehicle.

Among plural electric vehicles (client vehicles), for an electric vehicle whose battery 200 is degraded to a predetermined level or lower and the future SOH is estimated to be decreased by a predetermined amount or greater, the battery control program and the route and drive pattern in autonomous driving are changed so as to delay the degradation of the battery 200 (to ease the usage conditions of the battery 200, for example). It is thus possible to suitably regulate the degradation of the battery 200 of each electric vehicle.

Hence, the content of a control program installed in each electric vehicle can be set without allowing excessively large safety margins. This allows the battery 200 to exhibit its performance more properly, thereby making it possible to improve the performance of the electric vehicle.

Additionally, guaranteeing the performance of a vehicle over a certain period (life cycle of a vehicle, for example) becomes relatively easy, thereby improving the reliability and resale value of the vehicle.

(2) Each client vehicle has an autonomous driving function, which lessens variations of driving performance of individual drivers. This can enhance the precision in estimating the SOH of a battery 200 and also control a vehicle more suitably to delay the degradation of the battery 200.

(3) For a client vehicle whose SOH of the battery 200 is lower than that of the standard battery degradation line and whose future SOH is estimated to be decreased, the route to be used in autonomous driving control is changed so that the vehicle climbs slopes less frequently and/or performs acceleration/deceleration less frequently. This can reduce the charge/discharge current of the battery 200 and the frequency with which the battery 200 is charged/discharged, thereby making it possible to appropriately regulate the degradation of the battery 200.

(4) For a client vehicle whose SOH of the battery 200 is lower than that of the standard battery degradation line and whose future SOH is estimated to be decreased, the battery control program is updated to reduce output from the motor generator 190. This can decrease the maximum discharge current of the battery 200, thereby making it possible to suitably delay the degradation of the battery 200.

MODIFIED EXAMPLES

The disclosure is not limited to the above-described embodiment and may be modified and changed variously. Embodiments obtained by modifying and changing the above-described embodiment are also encompassed in the technical scope of the disclosure.

(1) The configurations of the battery management system and the electric vehicle are not restricted to those discussed in the embodiment and may be changed appropriately.

For example, a function distributed to plural units in the embodiment may be integrated into a single unit. Conversely, a function implemented by a single unit in the embodiment may be distributed over plural units.

(2) Although the electric vehicle, which is a client vehicle, is an engine-electric hybrid passenger vehicle in the embodiment, it may be another type of electric vehicle having a driving battery.

The type of vehicle is not limited to a particular type, such as a passenger car, and may be another type of vehicle, such as a commercial vehicle, a heavy duty vehicle, or a motorcycle.

The electric vehicle is not limited to an engine-electric hybrid vehicle and may be another type of vehicle having a driving battery, such as a pure electric vehicle or an electric vehicle or a hydrogen vehicle including a range extender.

Plural client vehicles may include multiple types of vehicles having different specifications and or different types of power units.

(3) In the embodiment, the estimated battery degradation line is defined as the SOH in relation to a period of time elapsed from the start of the use of a battery. Alternatively, the estimated battery degradation line may be defined as the SOH in relation to another factor, such as the distance by which a vehicle has driven from the start of the use of the battery or the time for which the battery is actually operated.

(4) The content of control to be performed for delaying the degradation of a battery in the embodiment is only an example and may be changed appropriately.

For example, in a vehicle that can drive in the EV drive mode only with a motor generator without starting an engine in response to a user operation, if a battery is degraded by a predetermined amount or greater, a user may not be able to select the EV drive mode.

(5) Parameters concerning the usage state of a battery in the embodiment are only examples and may be changed appropriately.

(6) In the embodiment, the setting of a route in autonomous driving in accordance with the SOH of a battery is performed by the server (outside the vehicle). Instead, a route setting program installed in a vehicle may be updated to have a similar function.

(7) In the embodiment, the battery control program is generated in the server (outside the vehicle) in accordance with the future degradation state (SOH) of a battery. Instead, various control programs to be used for different degradation states of a battery may be stored in a vehicle in advance and may be switched in response to an instruction to change vehicle control from the server.

According to an embodiment of the disclosure, information obtained from a degradation state detector and a usage state detector of each of plural electric vehicles is accumulated, and the degradation state of a battery is estimated based on the accumulated information. This makes it possible to estimate the current and future degradation states of a battery more precisely than when the degradation state of the battery of a vehicle is estimated only in this vehicle by using information about this vehicle.

Among plural electric vehicles, for an electric vehicle whose battery is degraded to a predetermined level or lower and whose future degradation state of the battery is estimated to be decreased by a predetermined amount or greater, control of this vehicle is changed so as to delay the degradation of the battery. It is thus possible to appropriately regulate the degradation of the battery of each electric vehicle.

Hence, the content of a control program installed in each electric vehicle can be set without allowing excessively large safety margins. This allows the battery to exhibit its performance more properly, thereby making it possible to improve the performance of the electric vehicle.

Each client vehicle has an autonomous driving function, which lessens variations of driving performance of individual drivers. This can enhance the precision in estimating the degradation state of a battery and also control a vehicle more suitably so as to delay the degradation of the battery.

Additionally, as a result of easing the usage conditions of a battery, the degradation of the battery can be delayed reliably.

As described above, it is possible to provide a battery management system for electric vehicles and an electric vehicle in which vehicle control can be performed suitably in accordance with the degradation state of a battery.

The engine control unit 100, the battery control unit 201, the transmission control unit 210, the hybrid powertrain control unit 220, the autonomous driving control unit 300, the environment recognition unit 310, the steering control unit 320, the brake control unit 330 in the vehicle V illustrated in FIG. 1 and the client vehicle manager 410, the battery control program updater 411, the autonomous driving route setter 412, and the battery degradation estimation map generator 430 in the server 400 illustrated in FIG. 2 can be implemented by circuitry including at least one semiconductor integrated circuit such as at least one processor (e.g., a central processing unit (CPU)), at least one application specific integrated circuit (ASIC), and/or at least one field programmable gate array (FPGA). At least one processor can be configured, by reading instructions from at least one machine readable tangible medium, to perform all or a part of functions of the engine control unit 100, the battery control unit 201, the transmission control unit 210, the hybrid powertrain control unit 220, the autonomous driving control unit 300, the environment recognition unit 310, the steering control unit 320, the brake control unit 330 in the vehicle V and the client vehicle manager 410, the battery control program updater 411, the autonomous driving route setter 412, and the battery degradation estimation map generator 430 in the server 400. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the non-volatile memory may include a ROM and a NVRAM. The ASIC is an integrated circuit (IC) customized to perform, and the FPGA is an integrated circuit designed to be configured after manufacturing in order to perform, all or a part of the functions of the modules illustrated in FIGS. 1 and 2.

The invention claimed is:

1. A battery management system for electric vehicles, the battery management system comprising:
a plurality of electric vehicles each including a battery configured to supply electric power to a driving motor; and
an information processor configured to be able to communicate with the plurality of electric vehicles,
each of the plurality of electric vehicles comprising
a degradation state detector configured to detect a degradation state of the battery, and
a usage state detector configured to detect a usage state of the battery,
the information processor comprising
a battery information storage configured to store information about the degradation state and the usage state of the battery of each of the plurality of electric vehicles,
a degradation state estimator configured to estimate a future degradation state of the battery of a specific electric vehicle among the plurality of electric vehicles, based on the information stored in the battery information storage, and
a vehicle control changer configured to change control of a certain electric vehicle among the plurality of electric vehicles so as to delay degradation of the battery of the certain electric vehicle in a case where the degradation state estimator has estimated that the future degradation state of the battery of the certain electric vehicle is to be decreased by a predetermined amount or greater.

2. The battery management system according to claim 1, wherein each of the plurality of electric vehicles has an autonomous driving function configured to autonomously perform steering and acceleration/deceleration.

3. The battery management system according to claim 1, wherein the vehicle control changer is configured to change a route in autonomous driving control so that the certain electric vehicle performs acceleration/deceleration less frequently and/or climbs slopes less frequently.

4. The battery management system according to claim 2, wherein the vehicle control changer is configured to change a route in autonomous driving control so that the certain electric vehicle performs acceleration/deceleration less frequently and/or climbs slopes less frequently.

5. The battery management system according to claim 1, wherein the vehicle control changer is configured to change control of the driving motor of the certain electric vehicle so as to reduce output of the driving motor.

6. The battery management system according to claim 2, wherein the vehicle control changer is configured to change control of the driving motor of the certain electric vehicle so as to reduce output of the driving motor.

7. The battery management system according to claim 3, wherein the vehicle control changer is configured to change control of the driving motor of the certain electric vehicle so as to reduce output of the driving motor.

8. The battery management system according to claim 4, wherein the vehicle control changer is configured to change control of the driving motor of the certain electric vehicle so as to reduce output of the driving motor.

9. An electric vehicle including a battery configured to supply electric power to a driving motor, the electric vehicle comprising:
- a degradation state detector configured to detect a degradation state of the battery;
- a usage state detector configured to detect a usage state of the battery; and
- a communicator configured to send information about the degradation state and the usage state of the battery to an information processor disposed outside the electric vehicle and also to receive an instruction to change vehicle control from the information processor in a case where the information processor has estimated that a future degradation state of the battery of the electric vehicle is to be decreased by a predetermined amount or greater,
wherein the electric vehicle is configured to change control performed in the electric vehicle in response to receiving the instruction so as to delay degradation of the battery of the electric vehicle.

10. A battery management system for electric vehicles, the battery management system comprising:
- a plurality of electric vehicles each including a battery configured to supply electric power to a driving motor; and
- an information processor configured to be able to communicate with the plurality of electric vehicles, each of the plurality of electric vehicles comprising
circuitry configured to
detect a degradation state of the battery, and
detect a usage state of the battery, the information processor comprising
a battery information storage configured to store information about the degradation state and the usage state of the battery of each of the plurality of electric vehicles, and
circuitry configured to
estimate a future degradation state of the battery of a specific electric vehicle among the plurality of electric vehicles, based on the information stored in the battery information storage, and
change control of a certain electric vehicle among the plurality of electric vehicles so as to delay degradation of the battery of the certain electric vehicle in a case where the future degradation state of the battery of the certain electric vehicle is estimated to be decreased by a predetermined amount or greater.

11. An electric vehicle including a battery configured to supply electric power to a driving motor, the electric vehicle comprising:
circuitry configured to
detect a degradation state of the battery,
detect a usage state of the battery,
send information about the degradation state and the usage state of the battery to an information processor disposed outside the electric vehicle,
receive an instruction to change vehicle control from the information processor in a case where the information processor has estimated that a future degradation state of the battery of the electric vehicle is to be decreased by a predetermined amount or greater, and
change control performed in the electric vehicle in response to receiving the instruction so as to delay degradation of the battery of the electric vehicle.

\* \* \* \* \*